United States Patent
Klocek et al.

[11] Patent Number: 6,160,661
[45] Date of Patent: Dec. 12, 2000

[54] INFRARED TRANSMISSIVE PROTECTIVE WINDOW

[75] Inventors: Paul Klocek, Garland, Tex.; Peter Taborek, Irvine, Calif.

[73] Assignee: Raytheon Company, Lexington, Mass.

[21] Appl. No.: 08/790,123

[22] Filed: Jan. 29, 1997

Related U.S. Application Data

[63] Continuation of application No. 08/477,026, Jun. 7, 1995, abandoned, which is a continuation of application No. 07/776,716, Oct. 15, 1991, Pat. No. 5,712,724, which is a continuation of application No. 07/546,070, Jun. 27, 1990, abandoned.

[51] Int. Cl.[7] .................................................... F21V 9/04
[52] U.S. Cl. .................................... 359/359; 359/350
[58] Field of Search .................................. 359/359, 350, 359/900

[56] References Cited

U.S. PATENT DOCUMENTS

| | | | |
|---|---|---|---|
| 4,770,479 | 9/1988 | Tustison | 359/359 |
| 5,712,724 | 1/1998 | Klocek et al. | 359/350 |

*Primary Examiner*—Hung X. Dang
*Attorney, Agent, or Firm*—Baker Botts L.L.P.

[57] ABSTRACT

An electro-optic system 10 is described which comprises an infrared sensor 12 and a processing unit 14 protected by a protective infrared transmissive window 16. The window 16 comprises a substrate layer 18 which may comprise gallium arsenide, zinc selenide, zinc sulfide or germanium. A protective layer 22 of gallium phosphide is formed outwardly from the substrate layer 18. An anti-reflective coating 20 is formed inwardly from substrate layer 18 and an outward anti-reflective coating 26 is formed outwardly from protective layer 22. The incorporation of protective layer 22 allows for excellent impact and wear resistance without interfering with the optical characteristics of the protective window 16.

14 Claims, 1 Drawing Sheet

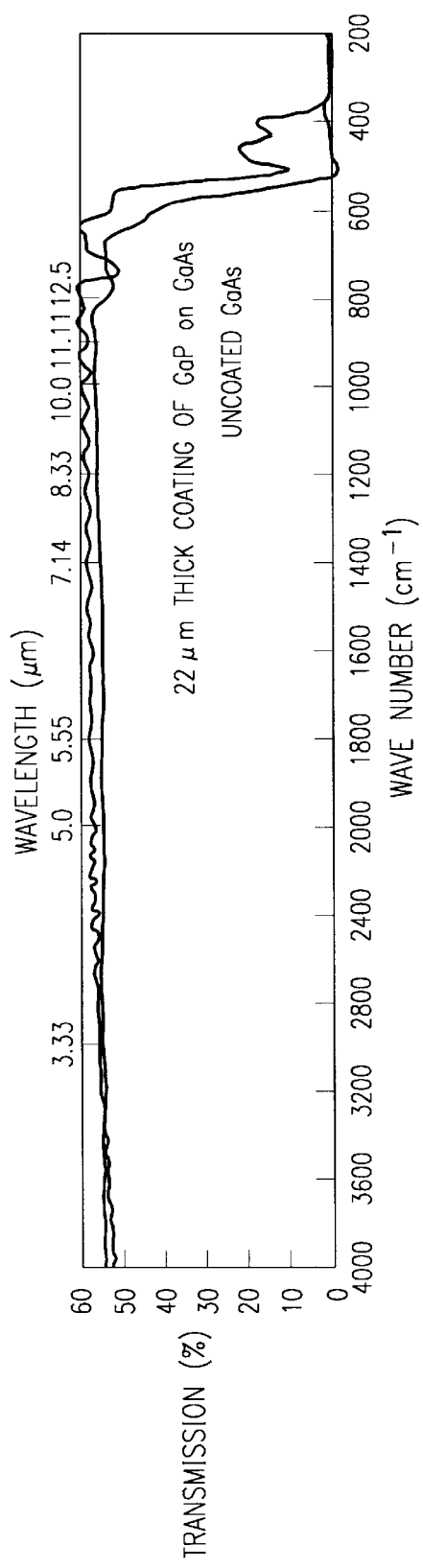
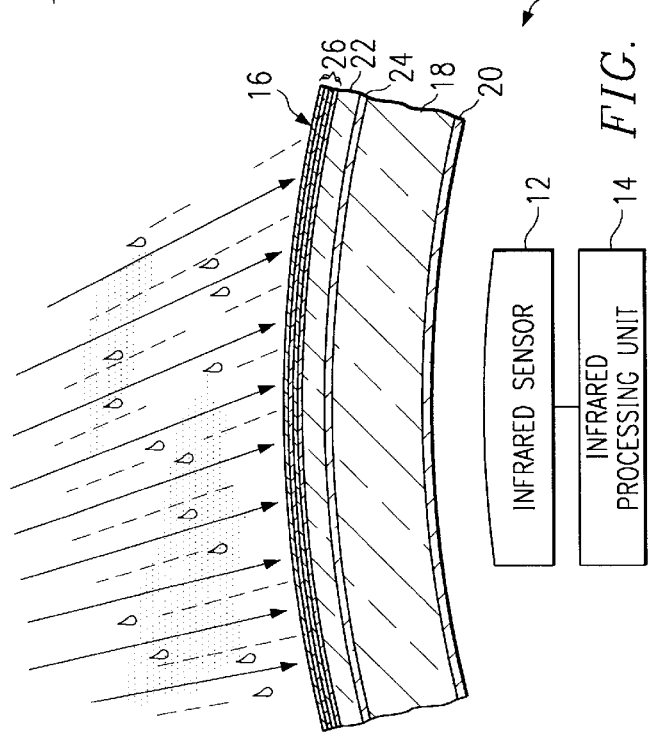

INFRARED TRANSMISSIVE PROTECTIVE WINDOW

This application is a continuation of U.S. Ser. No. 08/477,026 filed on Jun. 7, 1995 and entitled "Infrared Transmissive Protective Window" now abandoned, which is a continuation of U.S. Ser. No. 07/776,716 filed on Oct. 15, 1991 and entitled "Infrared Transmissive Protective Window" now U.S. Pat. No. 5,712,724, which is a continuation of U.S. Ser. No. 07/546,070 filed on Jun. 27, 1990 and entitled "Infrared Transmissive Protective Window" now abandoned.

TECHNICAL FIELD OF THE INVENTION

This invention relates in general to the field of electro-optical components and more particularly to a infrared transmissive protective window which comprises a layer of gallium phosphide.

BACKGROUND OF THE INVENTION

The ability to accurately sense infrared radiation has become an important technical consideration in a variety of military and civilian applications. The sensors used to detect the infrared radiation must be protected from environmental hazards. This is usually done by placing the sensors behind infrared transmissive windows or domes. During the lifetime of the electro-optic system, these protective windows and domes suffer from environmental degradation. This is particularly true of windows and domes designed to protect sensors receiving the eight to twelve micron wavelength region of infrared radiation as these protective windows and domes are commonly constructed from zinc sulfide (ZnS), germanium (Ge), zinc selenide (ZnSe) and gallium arsenide (GaAs). The environmental degradation of the protective windows and domes is the result of exposure to rain and other particle wear which can cause impact damage and general erosion of the outer surface of the protective window or dome. This degradation results in a loss of transmission through the component and at times can result in catastrophic failure of the dome resulting in the destruction of the protected electro-optic sensor. The environmental degradation discussed previously is exacerbated if the window or dome is on a high speed platform like a plane or a missile as is common in military applications.

For the most part, efforts to construct protective windows and domes having more resistance to environmental degradation have focused on developing protective coatings for the windows and domes. This is due to the limited choice of materials for the domes and windows themselves which allow transmission of infrared radiation in the eight to twelve micron wavelength region. Coatings comprising diamond-like carbon have been developed and used in the past. Diamond-like carbon offers some wear resistance but can only be used as very thin coatings due to the optical absorption of the material. For example, a typical diamond-like carbon coating can only be one to two microns in thickness without appreciably affecting the optical characteristics of the dome or window. Other materials such as boron phosphide and germanium carbide are being developed but still have shown unacceptable levels of optical absorption at coating thicknesses sufficient to provide impact and wear resistance for the dome or window.

Accordingly, a need has arisen for an improved infrared transmissive window to protect electro-optic components.

SUMMARY OF THE INVENTION

In accordance with the teachings of the present invention, an infrared transmissive protective window is disclosed which comprises a substrate layer of an infrared transmissive material. A protective layer of gallium phosphide is disposed outwardly from the substrate layer.

According to some specific embodiments of the present invention, the substrate layer may comprise gallium arsenide, zinc sulfide, germanium, or zinc selenide.

According to a further embodiment of the present invention, an anti-reflective coating may be formed on the outer surface of the protective layer of gallium phosphide. A further anti-reflective coating may be formed on the inner surface of the substrate layer.

BRIEF DESCRIPTION OF THE DRAWINGS

A more complete understanding of the present invention may be acquired by referring to the detailed description and claims when considered in connection with the accompanying figures, wherein:

FIG. 1 is a graphical representation of the relative transmission characteristics of an uncoated gallium arsenide substrate with a gallium arsenide substrate having a coating of gallium phosphide formed thereon; and FIG. 2 is a cross-sectional schematic illustration of an electro-optic system comprising a protective window constructed according to the teachings of the present invention.

DETAILED DESCRIPTION OF THE INVENTION

According to the teachings of the present invention, an improved infrared transmissive protective window has been developed which comprises a layer of gallium phosphide. Gallium phosphide offers broad infrared transmission over the 0.5 micron to 12 micron wavelength region. Gallium phosphide further provides for high hardness for wear resistance and high strength for impact resistance. Gallium phosphide further provides for a thermal expansion which is closely matched to the common infrared transmissive component materials which provides for low stresses in the coating and excellent chemical durability.

A typical protective dome or window is constructed of an infrared transmissive substrate such as gallium arsenide, germanium, zinc sulfide or zinc selenide on the order of a half an inch thick. According to one embodiment of the present invention, a layer of gallium phosphide may be epitaxially grown to a thickness on the order of 25 to 30 microns on the outer surface of the infrared transmissive substrate material. The coating of gallium phosphide can be grown using, for example, a conventional thermal chemical vapor deposition process using, for example, tertiary butyl arsenine, trimethyl phosphine, trimethyl gallium as feed gases.

By using conventional CVD techniques, stochiometric gallium phosphide may be epitaxally grown to give excellent optical characteristics. Further, the rate of growth of the gallium phosphide coating can be controlled to provide for the formation of polycrystalline gallium phosphide which improves the strength of the gallium phosphide coating. This is accomplished by speeding up the epitaxial growth of the gallium phosphide coating to provide for the formation of grain boundaries within the coating layer. The speeding up of the growth process also provides for economic benefits in that the process can proceed more quickly. Accordingly, conventional chemical vapor deposition techniques provide for exact stochiometric ratios and high purity which provide for excellent optical characteristics of the gallium phosphide layer and fast epitaxial growth provides for polycrystalline formation which increases the strength of the protective coating layer.

FIG. 1 illustrates the optical transmission characteristics of a 22 micron coating of gallium phosphide on a gallium arsenide substrate as it compares to an uncoated gallium arsenide substrate. As can be seen in FIG. 1, over the eight to twelve micron wavelength region, there is no loss in transmission as a result of the gallium phosphide coating. In fact, due to some impedance matching at the interface between the substrate and protective coating layer, there is some transmission gain over the region of interest. While FIG. 1 illustrates the experimental results of a gallium phosphide coating on a gallium arsenide substrate, it should be understood that the gallium phosphide coating could be applied with comparable results to the other common substrate materials—zinc sulfide, germanium and zinc selenide.

Gallium phosphide coated substrates have been tested for hardness, infrared transmission, adhesion and rain impact resistance. The hardness of the samples measured 700 using a Vickers micro-indention technique. This measurement is identical to what is measured in bulk single crystalline gallium phosphide which exhibits extremely high wear resistance. The rain impact resistance was measured with a single water drop, two millimeters in diameter, at MACH 0.9 with the gallium phosphide coated gallium arsenide at normal incidence. The test revealed very little damage which is indicative of gallium phosphide. The damage sustained by the gallium phosphide coated substrate was significantly less than the uncoated substrate.

The gallium phosphide coatings which have been tested exhibit optical absorption coefficients of less than $1 \text{ cm}^{-1}$. In comparison, other coatings which have been developed such as boron phosphide and germanium carbide alloys exhibit absorption coefficients on the order of $20 \text{ cm}^{-1}$. Gallium phosphide coatings therefore allow for very high impact and wear resistance while exhibiting almost no optical interference with the underlying infrared electro-optic sensors.

FIG. 2 illustrates an electro-optic system which is indicated generally at 10. Electro-optic system 10 comprises an infrared sensor 12 which is coupled to a processing unit 14. Infrared sensor 12 is protected from environmental degradation by an infrared transmissive protective window, indicated generally at 16. Protective window 16 comprises an infrared transmissive substrate layer 18. As discussed previously, infrared transmissive substrate layer 18 may comprise, for example, gallium arsenide, zinc sulfide, germanium or zinc selenide. It should be understood that the layers shown in FIG. 2 are not to scale. The thickness of the entire window 16 would be on the order of one-half inch in thickness. The great majority of the thickness is accounted for by the substrate layer 18. On the inner surface of substrate layer 18, a conventional anti-reflective coating layer 20 is formed. A variety of materials known in the art may be used to form anti-reflective layer 20. As layer 20 resides on the inner surface of the protective window 16, it need not offer any wear or impact resistance.

A layer 22 of gallium phosphide is formed outwardly from substrate layer 18. As discussed previously, gallium phosphide layer 22 may be on the order of 25 to 30 microns in thickness. An interface region 24 is shown disposed between substrate 18 and gallium phosphide layer 22. Interface region 24 comprises a graded layer approximately five microns in thickness which comprises gallium, arsenic and phosphorous. Region 24 may be formed by conventional methods during the epitaxial growth of gallium phosphide layer 22 on the outer surface of substrate layer 18. Region 24 is not a defined layer, but rather is a region where the concentration of the materials is gradually changed during the growth of the layer so that there is a gradual change from the gallium arsenide used to form substrate 18 to the gallium phosphide used to form layer 22. This gradual change in materials allows for improved optical characteristics and improved thermal matching of the layer 22 with the substrate layer 18.

An outer anti-reflective layer 26 is formed outwardly from layer 22. Anti-reflective layer 26 may comprise, for example, alternating layers of silicon and amorphous carbon. Anti-reflective layer 26 may be on the order of one to two microns in thickness. The use of alternating layers of silicon and amorphous carbon provide for the necessary anti-reflective effects as well as providing for additional wear resistance for the window 16. The relative thicknesses of the layers of silicon and amorphous carbon may be dynamically adjusted during the formation of layer 26 according to the complex index of refraction of the materials as they are formed.

The complete window 16 provides for protection of infrared sensor 12 without interfering with the transmission of infrared radiation through the window 16. Additionally, the incorporation of a protective coating of gallium phosphide in the window 16 provides for excellent wear and impact resistance without degrading the optical transmission characteristics of the window 16.

Although the teachings of the present invention have been described in detail with reference to the embodiments described herein, it should be understood that a variety of substitutions and alterations may be made hereto without departing from the spirit and scope of the present invention which is defined solely by the appended claims.

What is claimed is:

1. A protected infrared transmissive window for protecting a device operating at infrared frequency, said window comprising:
   (a) an infrared transmissive window portion having a pair of opposing major surfaces, one of said major surfaces more remote from said device operating at infrared frequency than the other of said major surfaces;
   (b) an infrared transmissive gallium phosphide protective layer disposed on said one of said major surfaces more remote from said device for protecting said window; and
   (c) a graded interface layer disposed between said protective layer and said window portion, said interface layer being composed of the material of said window portion and gallium phosphide and gradually changing from all the material of said window portion on said window portion to all gallium phosphide at said protective layer.

2. The protected window of claim 1 wherein said infrared transmissive window portion comprises a material from the class consisting of gallium arsenide, zinc sulfide, zinc selenide and germanium.

3. The protected window of claim 1 wherein said protective layer comprises an outer surface remote from said window and further comprising an antireflective coating disposed on said outer surface.

4. An electro-optic system comprising:
   (a) an infrared sensor; and
   (b) a protected infrared transmissive window for protecting said sensor, said window comprising:
      (i) an infrared transmissive window portion having a pair of opposing major surfaces, one of said major surfaces more remote from said infrared sensor than the other of said major surfaces;
      (ii) an infrared transmissive gallium phosphide protective layer disposed on said one of said major surfaces more remote from said infrared sensor for protecting said window; and (iii) a graded interface layer disposed between said protective layer and said window portion, said interface layer being composed of the material of said window portion and gallium phosphide and gradually changing from all the material of said window portion on said window portion to all gallium phosphide at said protective layer.

5. The system of claim 4 wherein said infrared transmissive window portion comprises a material from the class consisting of gallium arsenide, zinc sulfide, zinc selenide and germanium.

6. The system of claim 4 wherein said protective layer comprises epitaxially formed polycrystalline gallium phosphide.

7. the system of claim 4 wherein said protective layer includes an outer surface remote from said window and further includes an antireflective coating on said outer surface.

8. The system of claim 7 wherein said antireflective coating comprises a layer of silicon and a layer of amorphous carbon.

9. A method for forming and positioning an infrared transmissive protective window, comprising the steps of:

(a) forming said window by:
 (i) heating a substrate layer comprising an infrared transmissive material which has a pair of opposing major surfaces;
 (ii) forming a graded interface layer on one of said major surfaces; and
 (iii) forming a protective layer of gallium phosphide on said graded layer;
 (iv) said graded layer being composed of the material of said substrate portion and gallium phosphide and gradually changing from all the material of said substrate on said substrate to all gallium phosphide at said protective layer; and (b) disposing said window relative to a system to be protected so that said protective layer and said one of said major surfaces are remote from said system to be protected relative to the other of said major surfaces.

10. The method of claim 9 wherein said substrate is essentially germanium.

11. The method of claim 9 wherein said substrate is essentially gallium arsenide.

12. The method of claim 9 wherein said substrate is essentially zinc selenide.

13. The method of claim 9 wherein said substrate is essentially zinc sulfide.

14. The method of claim 9 and further comprising the step of forming an antireflective coating on said protective layer extending in a direction from said protective layer away from said system to be protected.

* * * * *